United States Patent
Novichkov et al.

(10) Patent No.: US 8,495,119 B2
(45) Date of Patent: Jul. 23, 2013

(54) EFFICIENT CHECK NODE MESSAGE TRANSFORM APPROXIMATION FOR LDPC DECODER

(75) Inventors: Vladimir Novichkov, Towaco, NJ (US); Tom Richardson, South Orange, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 968 days.

(21) Appl. No.: 12/348,674

(22) Filed: Jan. 5, 2009

(65) Prior Publication Data

US 2009/0177869 A1 Jul. 9, 2009

Related U.S. Application Data

(63) Continuation of application No. 11/082,405, filed on Mar. 17, 2005, now Pat. No. 7,475,103.

(51) Int. Cl.
*G06F 7/483* (2006.01)

(52) U.S. Cl.
USPC .......................................................... 708/277

(58) Field of Classification Search
None
See application file for complete search history.

(56) References Cited

U.S. PATENT DOCUMENTS

| | | | |
|---|---|---|---|
| 4,583,180 A | 4/1986 | Kmetz | |
| 5,365,465 A | 11/1994 | Larson | |
| 5,798,957 A | 8/1998 | Pan et al. | |
| 6,144,977 A | 11/2000 | Giangarra et al. | |
| 6,633,856 B2 | 10/2003 | Richardson et al. | |
| 6,671,796 B1 | 12/2003 | Sudharsanan et al. | |
| 6,785,863 B2 | 8/2004 | Blankenship et al. | |

(Continued)

FOREIGN PATENT DOCUMENTS

| | | |
|---|---|---|
| TW | 405093 B | 9/2000 |
| TW | 412690 B | 11/2000 |

(Continued)

OTHER PUBLICATIONS

"Logarithmic fixed-point number" [Online] Sep. 24, 2004, p. 1, XP002407457 Retrieved from the Internet: URL:http//books.w3k.org/html/mdft.Logarithmic_Fixed_Point_Numbers.html>[retrieved on Nov. 15, 2006] the whole document.

(Continued)

*Primary Examiner* — David H Malzahn
(74) *Attorney, Agent, or Firm* — Sam Talpalatsky; Nicholas J. Pauley; Joseph Agusta

(57) ABSTRACT

In modern iterative coding systems such as LDPC decoder and turbo-convolutional decoder in which the invention may be used, the core computations can often be reduced to a sequence of additions and subtractions alternating between logarithm and linear domains A computationally efficient and robust approximation method for log and exp functions is described which involves using a simple bit mapping between fixed point fractional data format and floating point format. The method avoids costly lookup tables and complex computations and further reduces the core processing to a sequence of additions and subtractions using alternating fixed point and floating point processing units. The method is well suited for use in highly optimized hardware implementations which can take advantage of modern advances in standard floating point arithmetic circuit design as well as for software implementation on a wide class of processors equipped with FPU where the invention avoids the need for a typical multi-cycle series of log/exp instructions and especially on a SIMD FPU-equipped processors where log/exp functions are typically scalar.

18 Claims, 6 Drawing Sheets

U.S. PATENT DOCUMENTS

| | | | |
|---|---|---|---|
| 6,938,196 B2 | 8/2005 | Richardson et al. | |
| 7,475,103 B2 | 1/2009 | Novichkov et al. | |
| 7,644,116 B2* | 1/2010 | Tandon et al. | 708/277 |
| 2003/0005006 A1* | 1/2003 | Chatterjee | 708/277 |
| 2003/0014453 A1* | 1/2003 | Challa et al. | 708/277 |
| 2003/0101206 A1* | 5/2003 | Graziano et al. | 708/277 |
| 2007/0282936 A1* | 12/2007 | Tandon et al. | 708/277 |

FOREIGN PATENT DOCUMENTS

| | | |
|---|---|---|
| TW | 440814 B | 6/2001 |
| TW | 466843 B | 12/2001 |
| TW | 200500878 | 1/2005 |

OTHER PUBLICATIONS

J.F. Blinn: "Floating-Point Tricks" IEEE Computer Graphics and Applications, (Online) vol. 17, No. 4, Aug. 1997, pp. 80-84, XP002407431, Retrieved from the Internet URL:http//ieeeexplore.ieee.org/iell/38/13035/0595279.pdf? Arnumber= 595279> [retrieve.

NN: "Adding floating point numbers" [Online] Oct. 21, 2004, pp. 1-3, XP002407432 Retrieved from Internet: URL:http//web,archive.org/web/2004107014905/http://www.cs.umd.edu/class/spring2003/cmsc311/Notes/BinMath/addFloat.html>[retrieved on Nov. 15, 2006].

NN: Creating a one byte floating point number [Online] Oct. 21, 2004, pp. 1-2. XP002407433 Retrieved from the Internet: URL:http//web.archive.org/web/20041027021345/www.cs.umd.edu/class/spring2003/cms31 1/Notes/BinMath/byteFloat.html>[retrieved on 20.

International Search Report—PCT/US2006/009839—International Search Authority—European Patent Office—Dec. 5, 2006.

International Preliminary Report—PCT/US2006/009839, International Search Authority—European Patent Office—Apr. 3, 2007.

Written Opinion—PCT/US2006/009839, International Search Authority—European Patent Office—Dec. 5, 2006.

Taiwan Search Report—TW095109239—TIPO—May 17, 2012.

* cited by examiner

EFFICIENT CHECK NODE MESSAGE TRANSFORM APPROXIMATION FOR LDPC DECODER

CROSS REFERENCE TO RELATED APPLICATIONS

This application is a continuation of application Ser. No. 11/082,405 filed on Mar. 17, 2005 now U.S. Pat. No. 7,475,103 for an Efficient Check Node Message Transform Approximation for LDPC Decoder which is hereby incorporated by reference.

FIELD OF THE INVENTION

The present invention is directed to methods and apparatus for approximating log and/or exp function computations, in hardware or software implementations, in a manner that is well suited for applications including, e.g., Turbo decoding, Low Density Parity Check decoding, and a wide range of other applications where exp or log function computations may be used.

BACKGROUND OF THE INVENTION

To facilitate an understanding of the invention LDPC decoding and Turbo decoding will now be discussed briefly.

1. LDPC Decoders

Computationally the belief propagation LDPC decoder with log-likelihood ratio message representation requires only simple additions and subtractions except for the message transform $F$ and $F^{-1}$ at the boundaries of the check node. The message transform is by far the most complex operation in the log domain LDPC decoder. It is therefore desirable to find low complexity approximation that maintains good decoding performance for all practically feasible coding rates and is at the same time computationally efficient.

Let $m^{v2c}$ denote the messages passed from variable node to check node, $m^{c2v}$ denote messages passed from check node to variable node, $Y_n$—soft input to the decoder variable node $n$ and $X_n$—soft output from the decoder and $D_n$—node degree.

The belief propagation update rule for variable node can be written as: $m_j^{v} \times \times 2 \times c = Y_{n+i} \cdot \text{di-elect cons.}[1,D] \times \times j \times m_i^{c} \times \times 2 \times v; v \times \times X_{n+i} \cdot \text{di-elect cons.}[1,D] \times m_i^{c} \times \times 2 \times v;$ (1)

Splitting the edge message into sign and magnitude values the check node update rule can be written as: $s_j^{c} \times \times 2 \times \times v = i \cdot \text{di-elect cons.}[1,D] \times \times j \times s_i^{v} \times \times 2 \times \times c$, $\times$ where $\times \times s_j^{v} \times \times 2 \times \times c, s_j^{c} \times \times 2 \times \times v$ (2) are message sign bits and the sum is over $GF(2)$ and $m_j^{c} \times \times 2 \times v = F^{-1} \times i \cdot \text{di-elect cons.}[1,D] \times \times j \times F \cdot \text{function.} (m_i^{v} \times \times 2 \times \times c)$, $\times$ where $\times \times m_j^{v} \times \times 2 \times \times c, m_j^{c} \times \times 2 \times \times v > 0$ (3) are message magnitudes and $F(x) = F^{-1}(x) = -\log(\tan \times \times h(x/2))$. (4)

While it is technically possible using look-up tables to directly map $F$ over a fixed argument interval defined by message quantization, such lookup table normally requires comparatively large hardware resources in a dedicated LDPC hardware decoder or an extra indirect memory access in a software implementation. It is also possible to compute $F$ exactly in a software implementation but such computation typically requires multiple cycles.

By observing series of $e^{-x}$ expansion of transform function $F$ $F(x) = 2 \times e^{-x} + 2 \cdot 3 \times e^{-3 \times x} + (5)$ and the argument $x$ distribution densities for both $F(x)$ and $F^{-1}(x)$ during decoder operation it has been demonstrated that the transform functions can be effectively approximated by: $\{\hat{F}\}(x) = 2e^{-x}$ for the forward transform, (6) $F^{-1}(x) = [-\log(x/2)] + (7)$ for the inverse transform, where the + at the end of the bracket means set to zero if negative, with a very little performance loss of under 0.015 dB for low rate codes ($r=1/6$) and nearly ideal performance for higher rate codes.

Without any loss of generality the approximation can be re-written for base-2 functions while adjusting decoder Log Likelihood Ratio (LLR) inputs by a factor of $1/\log(2)$: $\{\hat{F}\}(x) = 2 \times 2^{-x}$ for the forward transform, (8) $F^{-1}(x) = [-\log_2(x/2)] + (9)$ for the inverse transform.

2. Turbo-Convolutional Decoder.

Convolutional codes are used as constituent codes for turbo codes. A convolutional code is usually encoded by a finite state machine and the code can be represented on a trellis. The finite state machine has $K$ states $1, 2, \ldots, K$ and a transition function $T$ which given a "current" state and an information input $I$ produces a "next" state and an output $O$. For example, a standard binary convolutional code with memory 4 has 16 states which may be denote using the 16 binary sequences of length 4. The states correspond to the last 4 input bits. (The initial state is 0000.) Given a current state $b_1 b_2 b_3 b_4$ and input bit $x$, the next state is $b_2 b_3 b_4 x$. The output may be one or more bits each of which is linear function (over $GF[2]$) of the sequence $b_1 b_2 b_3 b_4 x$. In the abstract, one obtains a sequence of states $S[0], S[1], \ldots$ where $S[0]=0000$. For convenience we will refer to the index of the state as time. Thus $S[0]$ is the state at time 0. The transition from the state at time $t$ to the state at time $t+1$ depends on the input at time $t$.

Typically, each state may be reached from 2 preceding states and each state leads to 2 following states. The trellis for such a set of states is a graph with a vector of $K$ nodes for each time $t$ representing the $K$ possible states at time $t$. Nodes are connected by edges in the graph if and only if a state transition between those states is possible. Thus, nodes at time $t$ are connected only to nodes at time $t-1$ and time $t+1$. In the example above, and typically, each state node connects to 2 following nodes and 2 preceding nodes. The output symbols are usually transmitted through a channel. Observations of those symbols at the receiver induce probabilities on the associated transitions. In turbo decoding one attempts to compute the probabilities of the associated paths through the trellis. These are then used to compute posterior probabilities on the input bits. The algorithm that is used for this purpose is known as the BCJR algorithm.

A step in the BCJR algorithm, which can be used to implement an ideal soft-input soft-output terminated convolutional code MAP decoder used in Turbo decoding, has as one of its elementary steps the update of state probabilities as follows. Each state $S$ in a trellis is reachable from 2 or more preceding states and can move to 2 or more subsequent states. During implementation of the BCJR algorithm one computes the probability that the encoding path entered the state $S$, conditioned on all information available to the left of $S$ (e.g. from observations of variables associated to the left of $S$) and additionally conditioned on all information available to the right of $S$ (e.g. from observations of variables associated to the right of $S$ in the trellis). The state probability updates are commonly referred to as the ".alpha." update (from the left)

and the ".beta." update (from the right). These updates have the same basic form and we will focus only on the .alpha. update.

Assume that a probability vector (p.sub.1, p.sub.2, ..., p.sub.K) has been computed for trellis state S[t] and that this vector represents the conditional probability conditioned on all observations up to time t. E.g. p.sub.S is the posterior probability of that the trellis is in state S at time t conditioned on all observations up to time t. Observations associated to the transition from the state at time t to the state at time t+1 induce posterior probabilities on those transitions which we denote by e.g. p.sub.A2S[t] for the probability of transition from state A to state S at time t. Assuming that the states that lead to state S are state A and state B, we get p.sub.S[t+1]=(p.sub.A[t]p.sub.A2S[t]+p.sub.B[t]p.sub.B2S [t])/Z (10) where Z is a normalization constant to enforce the constraint that the sum over the states of p.sub.S[t+1] equals 1. It is clear from this formula that to compute p.sub.S[t+1] we need only know the vector (p.sub.1, p.sub.2, ..., p.sub.K)[t] up to a positive multiplicative constant. Similarly, the quantities p.sub.A2S[t] need only be known up to a positive multiplicative constant. Thus, in practice one does not enforce the normalization of either vector and simply defines p.sub.S[t+1]=(p.sub.A[t]p.sub.A2S[t]+p.sub.B[t]p.sub.B2S [t]) (11) where this vector is no longer required to sum to 1. Moreover, in practice it is convenient to compute not p.sub.S [t+1] but rather the logarithm of this quantity. Thus, one defines (.alpha..sub.1, .alpha..sub.2 ..., .alpha..sub.K)[t]= (log p.sub.1, log p.sub.2, ..., log p.sub.K)[t]. The update for this vector takes the form .alpha..sub.S[t+1]=log(exp(.alpha..sub.A[t]+
.gamma..sub.A2S[t])+exp(.alph-a..sub.B[t]+
.gamma..sub.B2S[t])) (12)

The additions inside the exponential function are easily performed and we observe that the critical computation is of the form log(exp x=exp y) (13) A standard approach to computing this function is to use the identity log(exp x+exp y)=max(x,y)+log(1+exp(-|x-y|)) (14) the second quantity then being computed by e.g. a lookup table.

When there are more than 2 branches then the number of terms might be larger. For example, if there are 4 branches then the update computation takes the form log(exp u+exp v+exp x+exp y) (15)

Similar to the previous LDPC decoder example by changing input data scale the expression ( ) can be re-written using base-2 functions as:

log 2(2.sup.u+2.sup.v+2.sup.x+2.sup.y) (16)

And the arguments in the next section can be applied in a similar way.

Those skilled in the art will recognize that the same idea applies in many soft input-soft output computational components of information transmission and storage systems.

One problem with decoding operations of the type described above is the complexity involved in computing exp and log computations as part of the decoding process. Such decoding operations are normally iterative in nature which can make efficient implementation important. While exact log and exp computations may be necessary for some applications, in many LDPC and turbo decoder applications reliable approximations of the exp and/or log functions can suffice. Accordingly, there is a need for efficient hardware and/or software methods of implementing log and/or exp functions that can be used to support LDPC decoding, turbo decoding and/or one or more other applications where approximations of exp and/or log computations can be used.

BRIEF SUMMARY OF THE INVENTION

Functions exp (x) and log (x) (and their base-2 counterparts) are extremely frequent in coding applications.

The present invention is directed to methods and apparatus for approximating log and exp functions in hardware and/or processing cycle efficient manner. Computationally efficient approximation method and apparatus for exp (x) and log (x) functions is a feature of the invention. The methods and apparatus of the present invention are well suited for a wide range of application, including low density parity check code (LDPC) decoding operations and turbo-decoding operations using log and/or exp functions (or approximations thereof).

In modern iterative coding systems such as LDPC decoder and turbo-convolutional decoder in which the invention may be used, the core computations can often be reduced to a sequence of additions and subtractions alternating between logarithm and linear domains A computationally efficient and robust approximation for log and exp functions is achieved in the invention by using a simple bit mapping between fixed point fractional data format and floating point format. The method avoids costly lookup tables and complex computations and further reduces the core processing to a sequence of additions and subtractions using alternating fixed point and floating point processing units. The method is well suited for use in highly optimized hardware implementations which can take advantage of modern advances in standard floating point arithmetic circuit design as well as for software implementation on a wide class of processors equipped with FPU where the invention avoids the need for a typical multi-cycle series of log/exp instructions and especially on a SIMD FPU-equipped processors where log/exp functions are typically scalar. The methods of the present invention may be used in an interactive manner or sequential manner with processing being switched between fixed point processing and floating point processing one or multiple times during an iterative or sequential processing operation.

The suggested approximation methods can be directly applied to the BCJR algorithm, e.g. to implementing formulas 21, 22. When applied to LDPC decoders, in some embodiments, the methods involve bit inversion operations which are not required for turbo-decoding implementations.

The approximation methods of the invention are based on change of bit interpretation every time the decoding process alternates between "log" and "linear" domain processing. The log and exp functions in the method of the present invention are not computed directly. Instead, operations in "log" domain are achieved by interpreting the magnitude of a message used in decoding as a fixed fractional point value. Decoding operations which are to be performed in the "linear" domain, in various embodiments, are implemented by interpreting bits to be processed in the decoding operation as a floating point number (e.g., a number in an IEEE-754 or similar floating point format). As part of the decoding process, there is at least one simple arithmetic operation following each interpretation change, e.g., a floating point operation is performed following interpretation as a floating point number and a fixed point computation is performed following an interpretation as a fixed point number.

Multiple changes in the interpretation of values being processed may occur during the decoding process, e.g., with changes in interpretation occurring as the iterative decoding process progresses.

The methods of the present invention are well suited to software decoder applications including embodiments which are implemented using one or more processors that include a SIMD FPU (Single Instruction Multiple Data Floating Point Unit). The software decoder embodiments are also well suited for use with processors that have processor architectures with dedicated FPU where FP additions and subtractions are single cycle operations and log/exp functions are multi-cycle operations. The software decoder embodiments can also be implemented using processors such as fixed point DSPs with floating point assist instructions, e.g., single cycle normalization and shift instructions.

The methods of the present invention can, and are, used in various hardware embodiments, e.g., of decoders, as well. In some embodiments reduced precision floating point arithmetic units including but not limited to floating point adders and subtractors are used to implement decoder operations intended to be performed in the "linear" domain and fixed point arithmetic units, including but not limited to fixed point adders and subtractors, are used to implement processing intended to be performed in the "log" domain. A delayed normalization method for multiple variables in "linear" domain implemented in accordance with the invention allows sharing normalization hardware between several floating point arithmetic units which occurs in some decoder implementations of the present invention.

The methods and apparatus of the invention are particularly well suited for implement LDPC check node processing modules. In one particular LPDC check node processing node embodiment, the methods of the invention support a case where no fractional bits are needed while a level of roundoff can be achieved which is suitable for many applications.

The approximation methods of the invention facilitate dynamic rate-dependent quantization step adjustments which can allow for a reduction in the number of bits used in an LLR magnitude representation. This translates to large savings in internal message memories (LDPC and other decoders).

Numerous additional features, benefits and embodiments of the present invention are described in the detailed description which follows.

DETAILED DESCRIPTION

Figure 1:
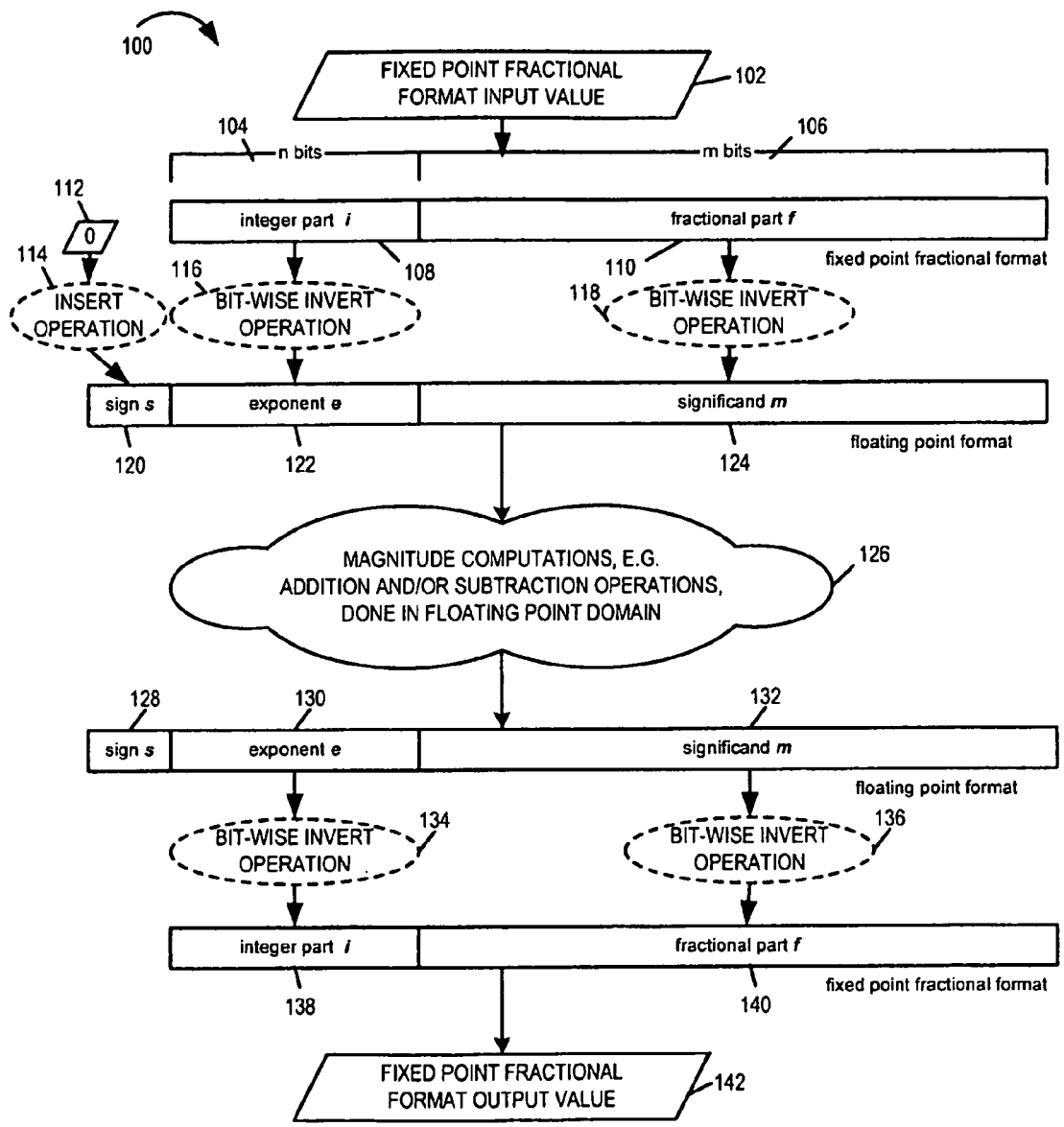
FIG. 1 illustrates steps of an exemplary method and hardware for approximating exp and/or log functions in accordance with the present.

The approximation of log/exp functions for LDPC decoder requires additional step described by formulas (17), (18).

Check node update between two transforms is a linear operation thus we can select an arbitrary scaling constant $C = 2^k$ such that new transform functions can be written as: $\hat{F}(x) = C 2^{-x} = 2^{k-x}$ for the forward transform, (17) $F^{-1}(x) = -\log_2(x C) = k - \log_2(x)$ (18) for the inverse transform.

For a practical system both input and edge message LLR values are scaled by $1/\log(2)$ for logarithm base conversion and quantized to a fixed point fractional format (n.m) with n bits in the integer part and m bits in the fractional part and k equal to the maximum LLR value for given quantization such that $x_1 = k - x \geq 0$. Also let i.f denote integer and fractional values of a quantized variable $x_1$.

There is a piecewise linear approximation of forward transform function $\hat{F}(x) = 2^{k-x} = 2^{x_1} = 2$ $$.\text{sup}.i.f = 2^i \cdot 2^{0.f} \approx 2^i \cdot (1+0.f) = 2^i \cdot \text{ti-mes}.1.f \quad (19)$$

The final approximation formula closely matches an IEEE-754 like representation of a floating point number $(-1)^s \cdot 2^e \cdot 1.m$ where i is the floating point exponent, f is significand, 1. is the leftmost '1' hidden after normalization and the number is always positive. The forward transform function therefore can be viewed as computing intermediate value $x_1$, then placing integer part i of the $x_1$ value into exponent field e of a floating point number and fractional part f into significand field m and then performing check node update addition and subtraction operations in the floating point domain. Typically maximum quantized LLR message value and the corresponding constant k is chosen in the form $2^n - 1$ and the computation of $x_1 = k - x$ is a simple bit-wise inversion of message value x. In a dedicated hardware implementation the bit-wise inversion operation can usually be fused with other operations or signal buffering and has virtually zero incremental cost. There is also a piecewise linear approximation of inverse transform function $\hat{F}^{-1}(x) = k - \log_2(x) = k - \log_2(2^e \cdot 1.m) = k - e - \log_2(1.m) \approx k - e - 0.m = k - e.m$ (20) Similarly the inverse transform can be viewed as mapping of the floating point exponent field e and significand field m into fixed point integer i and fractional f fields respectively followed by fixed point subtraction $k - x$. As in the forward transform the constant subtraction can be accomplished by bit-wise inversion.

For the coding schemes using core update in the form (16) like the turbo-convolutional core update the approximation does not normally require the substitution $x_1 = k - x$, the forward and inverse functions are simply $2^x$ and $\log_2(x)$, bit inversion is not needed and the transform approximations (19), (20) can be re-written as:

$$2^x = 2^{i.f} = 2^i \cdot 2^{0.f} \approx 2^i \cdot (1+0.f) = 2 \cdot .\text{sup}.i.\text{times}.1.f \quad (21)$$

$$\log_2(x) = \log_2(2^e \cdot 1.m) = e + \log_2(1.m) \approx e + 0.m = e.m \quad (22)$$

A simplified LDPC decoder check node message magnitude transform path is illustrated on the FIG. 1. FIG. 1 is a drawing 100 illustrating an exemplary approximation method useful for log and exp function computations in accordance with the present invention.

A fixed point fractional format input value 102 is received. Fixed point fractional input value 102 includes an n bit 104 integer part i 108 and an m bit 106 fraction part f 110.

In some embodiments, e.g., an exemplary LDPC embodiment, bit wise inversion operations are performed as operations 116 and 118. In such an embodiment, bit-wise invert operation 116 is performed on the n bit integer part i 108 resulting in a set of n bit values assigned to the exponent e 122 field of a floating point format representation and bit-wise invert operation 118 is performed on the m bit fractional part f 110 resulting in a set of m bit values assigned to the significant m field 124 of the floating point format representation.

In some embodiments, e.g., an exemplary Turbo decoder embodiment, bit wise inversion operations are not performed as operations 116 and 118. In such an embodiment, the n bit integer part i 108 resulting in a set of n bit values is assigned to the exponent e 122 field of a floating point format representation and the m bit fractional part f 110 is assigned to the significant m field 124 of the floating point format representation.

Some floating point format representations include a sign s field 120. In some such representations, an insert operation 114 is performed inserting either a constant value, e.g., 0 112 into the sign s field 120 as indicated on FIG. 1 or a variable value that can be used to dynamically select addition and subtraction operation.

Now, in operation 126 the resulting composite set of bits values included in the floating point representation is treated as a floating point value and subjected to magnitude computations, e.g., addition and/or subtraction operations, performed in the floating point domain. The output is a new set of bit values which when in floating point format includes: a sign field s bit value 128, exponent e field bit values 130, and significand m field bit values 132.

In some embodiments, e.g., an exemplary LDPC embodiment, bit wise inversion operations are performed as operations 134 and 136. In such an embodiment, bit-wise invert operation 134 is performed on of exponent e field bit values 130 resulting in bit values assigned to the integer part i 138 of fixed point fractional format representation, and bit-wise invert operation 136 is performed on of significand m field bit values 132 resulting in bit values assigned to the fractional part f field 140 of fixed point fractional format representation.

In some embodiments, e.g., an exemplary Turbo decoder embodiment, bit wise inversion operations are not performed as operations 134 and 136. In such an embodiment, exponent e field bit values 130 resulting are assigned to the integer part i 138 of fixed point fractional format representation, and significand m field bit values 132 are assigned to the fractional part f field 140 of fixed point fractional format representation.

The output value 142 is a fixed point fractional output value 142. The output value may be subjected to computations in the fixed point domain.

Floating point sign bit on the diagram is optional and needed only for implementations based on general purpose IEEE-754 hardware.

For devices supporting IEEE-754 32-bit floating point arithmetic (like general purpose CPU) the fixed point fractional message format (8.23) (8 integer bits, 23 fractional bits) is convenient as it requires no bit field manipulation between floating point check node computations and integer variable node computations. The message value is simply operated on as an integer value in the variable node update and floating point value in the check node update. For devices supporting both integer and floating point arithmetic on the same register set (like Intel™/AMD™ processors supporting SSE2™ SIMD instruction set) no additional data move instruction is needed for the transform operation.

The described above approximation technique leads to two practical embodiments:
1. Low Complexity Optimized Hardware Implementation.

A low cost or very high throughput implementation would dictate use of a dedicated decoder hardware with reduced message for LDPC decoder (branch metric for turbo decoder) quantization precision and dynamic range. Typically most coding gain can be achieved using 4 to 6 bits for representing input and edge message LLR values. Specific bit allocation between integer and fractional part of message value depends on required coding rate range and design tradeoffs.

The LDPC check node processor described in U.S. patent application Ser. No. 10/117,264 entitled "NODE PROCESSORS FOR USE IN PARITY CHECK DECODERS" can be modified to benefit from the current invention in the following way. Let (n.m) denote number of bits in integer and fractional parts of an edge message. After the edge message magnitude is separated it is bit-wise inverted and applied directly to an input of an edge accumulator comprised of a floating point adder for unsigned inputs and a register holding n bits of exponent and m+log.sub.2(D.sub.max)+p bits of significand, where D.sub.max represents the maximum node degree and p represents optional additional precision bits that may be required to achieve desired differential dynamic range in certain cases. The n bit wide integer bit field of inverted input magnitude is mapped to and exponent input of the adder and the m bit fractional field is padded with log.sub.2(D.sub.max)+p zeroes on the right and mapped to the significand input of the adder. Once all edges are accumulated the floating point sum value stored in a pipeline register. A subtraction stage follows addition stage similarly to the original design except that it also uses an unsigned floating point unit. The accumulated sum value is saturated either at the addition or the subtraction stage. For best precision adder exponent field can be expanded to n+1 bits and the saturation performed at the subtractor stage. Finally the outgoing message floating point value is bit-wise mapped to a fixed point fractional format, inverted and mixed with the sign which is processed separately. The variable node operates in the same or similarly as described in the original scheme described in U.S. patent application Ser. No. 10/117,264 entitled "NODE PROCESSORS FOR USE IN PARITY CHECK DECODERS" performing fixed point integer processing on edge messages.

Figure 2:
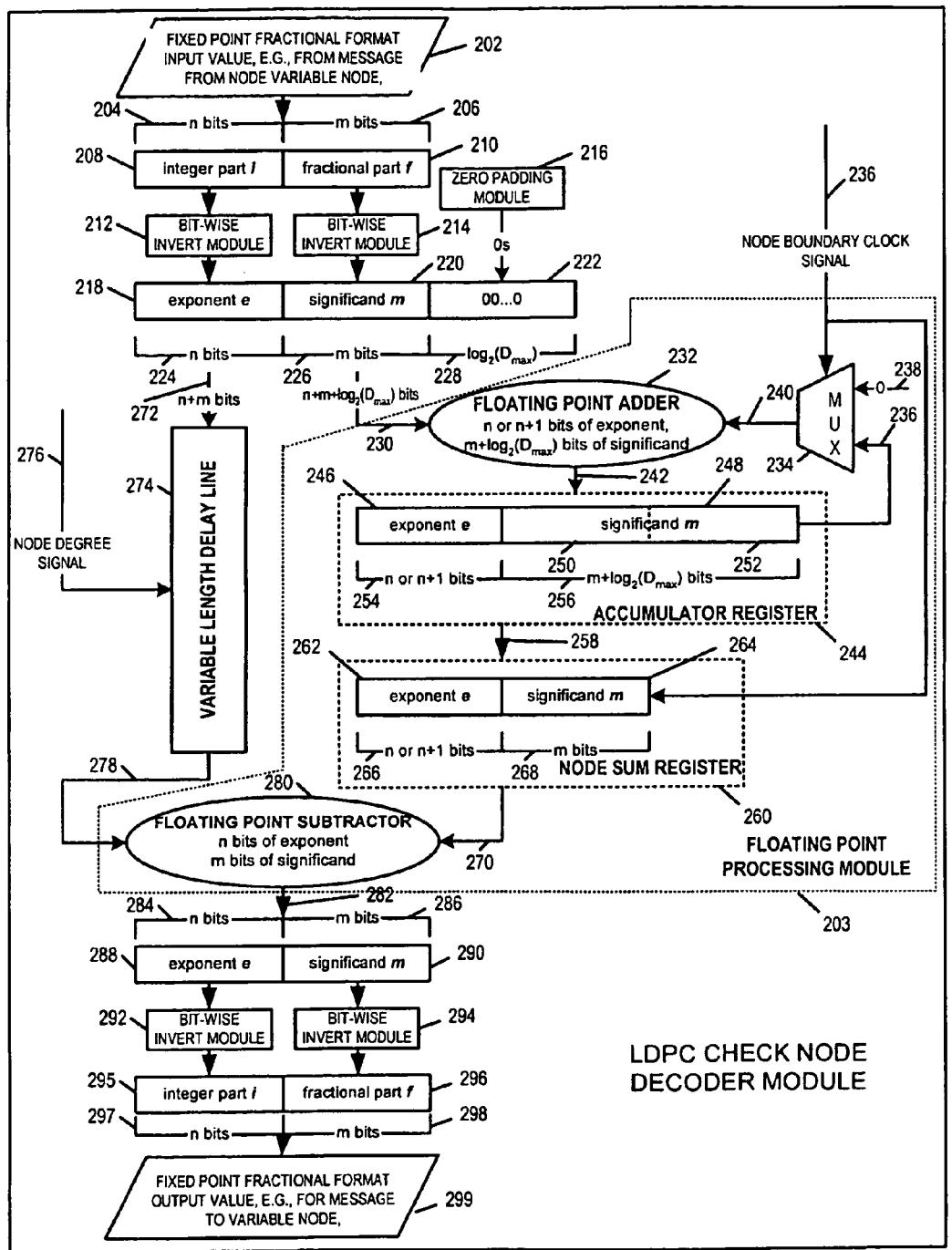
FIG. 2 illustrates an exemplary LDPC check node decoder module which implements the exp and log approximation methods of the present invention.

The optimized hardware check node message magnitude path processing is illustrated on the FIG. 2. FIG. 2 is a drawing of an exemplary LDPC check node decoder module 200 implemented in accordance with the present invention and using methods of the present invention.

Exemplary LDPC check node decoder module 200 includes bit wise invert modules 212, 214, 292, 294, a zero padding module 216, a floating point processing module 203 and a variable length delay module 274. Each bit-wise invert module may be, e.g., a set of computational logical bit invertors, one logical bit invertor for each bit that it is to be invert in parallel. For example bit wise invert module 214 may include m single bit invertors. Floating point processing module 203 includes a floating point adder 232, a multiplexer 234, an accumulator register 244, a node sum register 260, and a floating point subtractor 280.

Fixed point fraction format input value 202 is received by LDPC decoder module 202. For example the value 202 may be from an LLR message from a variable node. The input value 202 is represented in the fixed point fraction fractional format as having an integer part i 208 of n bits 204 and a fractional part f 210 on m bits 206. Bit wise invert module 212 inverts the value of each bit of integer part i 208 resulting in a set of corresponding bit values mapped into exponent e field 218. Bit wise invert module 214 inverts the value of each bit of fractional part f 210 resulting in a set of corresponding bit values mapped into significand m field 220. Zero padding module 216 fills the bits of the field 222. Exponent field e is n bits 224 wide; significant field m 220 is m bits wide; field 222 is log.sub.2(D.sub.max) bits wide 228, where D.sub.max represents the maximum node degree. In some cases zero padding field 222 may be wider than log.sub.2(.sub.Dmax) bits and either all or sections of the floating point processing module 203 precision may be extended to ensure sufficient differential dynamic range of computations. The composite of fields (218, 220, 222) representing a set of (n+m+log.sub.2 (D.sub.max)) bits 230 is an input to the floating point adder 232. The floating point adder 232 is structured such that it has an exponent of n or n+1 bits and a significant of (m+log.sub.2 (D.sub.max)) bits. The other input to the floating point adder 232 is the output 240 of multiplexer 234.

A node boundary clock signal 236 is a control signal to the multiplexer 234. For the first addition by floating point adder 232 following a node boundary, the multiplexer 234 is controlled to forward a set of zero bits 238 to add with the first set of bits 230. The output of floating point adder 232 is a set of bits 242 which is stored in accumulator register 244. The size of the accumulator register 244 is set to match the size of the floating point adder 232 with an exponent e field 246 of n or n+1 bits 254 and a significand field m 248 of (m+log.sub.2 (D.sub.max)) bits 248. The significant field m 248 is further divided into a first portion 250 of m bits and a second portion 252 of log.sub.2(D.sub.max) bits.

As a new set of bits 230 is input to the floating point adder 232, e.g., corresponding to another input 202 within the same node boundary, the floating point adder 232 sums the new set of inputs with the value from the accumulator register 244 which is input to the multiplexer as signal 236, passed through the multiplexer 236 and input to the adder 232 as signal 240. The output set of bits 242 of floating point adder 232 is stored in accumulator register 244. This adding and accumulation process continues for a set of inputs 202, e.g., corresponding to a set of messages.

Subsequently, output 258 from the accumulator register 244 is loaded into the node sum register 260. The load is controlled by node boundary clock signal 236 indicating that floating point summing operations corresponding to a set of fixed point fractional format input values 202, e.g., corresponding to set of messages, has been completed. The size of the sum register 260 is such that it has a set of n or n+1 bits 266 of storage locations, exponent e 262 storage, and a set of m bits 268 of storage locations, significand m 264 storage. The bits values of exponent e 246 of accumulator register 244 are loaded into the exponent e bit region 262 of node sum register 260. The bit values of portion 250 of accumulator register 244 are loaded into significand m bit region 264 of the node sum register 260.

As each of the n+m+log.sub.2(D.sub.max) bit value sets 230 corresponding to an input 202 is input to the adder 232, an n+m bit value set corresponding to the values of exponent e 218 and significand m 220 are forwarded into the variable length delay line 274. The node degree signal 276 controls the length of the delay line, e.g., so that when the node sum register 268 is loaded with a new value which it makes available to the floating point subtractor 270, the first set of n+m bit values 272 within the node boundary corresponding to the node sum register value will be available as input 278 the floating point subtractor 280.

Floating point subtractor 280 is structured to perform floating point subtraction between each set of bits 278 from the delay line and the value in the node sum register 260, resulting in output set of bits 282 which includes n bits 284 corresponding to an exponent e field 288 and m bits 286 corresponding to a significant m 290 field, the exponent e and the significant m 290 being a floating point format representation used by the floating point subtractor 280. Bit wise inversion module 290 inverts the bit values of the exponent e field 288 into an n bit 297 integer part i field of a fixed point fraction representation.

Bit wise inversion module 294 inverts the bit values of the significand m field 290 into an m bit 298 integer part f field 296 of a fixed point fraction representation. The resulting output value 299 is a fixed point fractional format output value, e.g., for an LLR message to a variable node.

Similar benefits can be obtained in alternative LDPC decoder architectures with different order of check node computations.

Update structure for turbo-convolutional decoder can be derived from (16), (21), (22) and involves using a reduced precision floating point adder for combining quantities u, v, x, y . . . from (16) and then interpreting them as fixed point fractional values elsewhere in the algorithm. The addition can be performed either sequential by a single FP accumulator (similar to LDPC node update accumulation phase described above) or in parallel by an adder tree depending on application requirements. For applications where message memory dominates the area occupied by the decoder yet the application requires support for wide range of coding rates further optimization can be achieved by storing messages at a lower precision than the total check node magnitude path precision and routing the reduced precision message to the check node integer and fractional fields in a way preferable for a particular coding rate. For example a check node supporting 6-bit (4.2) internal precision can accept 4-bit messages in the format (4.0) for high coding rates, (3.1) for medium coding rates and (2.2) for low coding rates with the appropriate zero padding, corresponding to the LLR quantization steps of ln(2), ln(2)/2, ln(2)/4. The zero padding and bit field routing can be accomplished by a simple shifter network at the boundaries of a check node. Variable node update is invariant of the bit allocation to fractional and integer parts and is done at 4-bit precision for each of the examples above. In this way, a 30% saving can be achieved for message memory, permutation network and optionally delay line with very little coding performance loss and relatively small check node hardware overhead. The bit field routing for reduced precision message storage is illustrated on FIG. 3.

Figure 3:
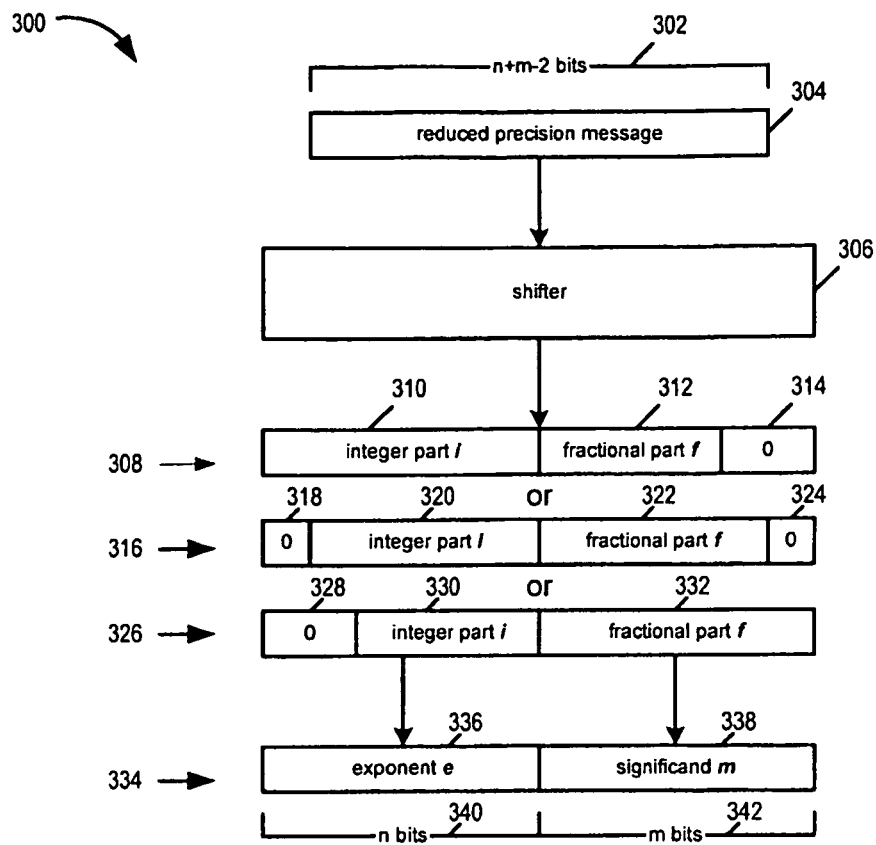
FIG. 3 illustrates various shifting operation used, in accordance with various embodiments, to support one or more different fixed point fractional representations.

FIG. 3 includes drawing 300 illustrating exemplary bit field routing for reduced precision message storage. An exemplary reduce precision message 304 includes n+m−2 bits 302, which is less than the total exemplary check node path precision of n+m bits. Shifter network 306, located at the boundary of a check node, performs zero padding and bit field routing. Three exemplary scenarios (308, 310, 312) of zero padding and shifting that may be performed by shifter network 306 are shown.

In example 308, the reduced precision message has been shifted and zero padded to include an integer part i 310 of n bits, a fractional part f 312 of m−2 bits, and a zero padded part 314 of two bits, the integer part i 310 and the fraction part f 312 corresponding to a first fixed point fractional format representation. Drawing 334 illustrates that an exemplary floating point representation includes an exponent e field 336 of n bits 340 and a significand m field 338 of m bits 342. The values of the n integer part i 310 bits map on a bit to bit basis to the exponent e field 336, while the composite of the values of the m−2 fractional part f 312 bits and the 2 zero padded bits 314 map on a bit to bit basis to the significand m field 338.

In example 316, the reduced precision message has been shifted and zero padded to include an a zero pad part 318 of 1 bit, an integer part i 320 of n−1 bits, a fractional part f 322 of m−1 bits, and a zero padded part 324 of one bit, the integer part i 320 and the fraction part f 322 corresponding to a second fixed point fractional format representation. Drawing 334 illustrates that an exemplary floating point representation includes an exponent e field 336 of n bits 340 and a significand m field 338 of m bits 342. The composite of the values of the one zero padded bit 318 and the values of the n−1 integer part i 320 bits map on a bit to bit basis to the exponent e field 336, while the composite of the values of the m−1 fractional part f 322 bits and the 1 zero padded bit 324 map on a bit to bit basis to the significand m field 338.

In example 326, the reduced precision message has been shifted and zero padded to include an a zero pad part 328 of 2 bits, an integer part i 330 of n−2 bits, and a fractional part f 332 of m bits, the integer part i 330 and the fraction part f 332 corresponding to a second fixed point fractional format representation. Drawing 334 illustrates that an exemplary floating point representation includes an exponent e field 336 of n bits 340 and a significand m field 338 of m bits 342. The composite of the values of the two zero padded bits 328 and the values of the n−2 integer part i 330 bits map on a bit to bit basis to the exponent e field 336, while the values of the m fractional part f 332 bits map on a bit to bit basis to the significand m field 338.

2. Vectorized Algorithm For A Fp Simd Capable General Purpose Cpus.

The approximation methods of the present invention can lead to a very efficient vectorized code for conventional SIMD architecture similar to but not limited to the Intel™ SSE2™ extensions. One key benefit of present invention is that the described transform approximation requires no lookup operation or complex computations. A typical lookup requires independent indirect memory access for each element in the vector and for a general purpose SIMD processor would lead to serial execution and drastic performance drop. Typical SIMD instruction set is optimized for matrix math and does not include vectorized instructions for log/exp functions. Moreover for most scalar FPU these instructions take multiple cycles to complete.

Regardless of a particular vectorization technique used approximation methods in accordance with the present invention as described above allow processing of a vector of values per cycle with little or no overhead for the transform operation. For Intel™ SSE2™ extensions for example the same vector of values present in SIMD register or memory can be operated on as a vector of integers in the log domain or as a vector of floating point values in the linear domain.

In some embodiments of the present invention, the approximation technique is synergetic to the vector LDPC code structure described in U.S. patent application Ser. No. 10/117,264 entitled "NODE PROCESSORS FOR USE IN PARITY CHECK DECODERS".

The practical implementation of software SIMD check node update, in accordance with methods of the present invention, would have similar data flow to exemplary hardware implementations as described above with the following specifics: [0080] edge message would typically be quantized to a higher precision matching the floating point number representation of a particular CPU target; [0081] padding of a floating point edge message representation with log.sub.2 (D.sub.max) zeroes is optional and can be done once during input LLR value quantization step; [0082] addition and subtraction operations will be performed in the native floating point number representation of a particular CPU target without explicit truncation operation; [0083] each of the check node update operations are fully vectorizable up to the maximum supported vector width of a particular CPU target; [0084] bit inversion step can be optionally fused with either sign separation or variable node processing;

3. Algorithm with Delayed Normalization.

In applications where multiple quantities are combined in the exponential domain (high degree node in LDPC graph or multiple branches in trellis) and dynamic normalization is not cost effective (fixed point CPU/DSP with only some FP assist instructions) the approximation framework above is still efficient if one selects common exponent for each of the combined values which allows using fixed point adders/subtractors and postpones normalization step until the domain change. The common exponent factor can be either a constant value if an application dynamic rage allows it or the smallest exponent in a group of values to be combined.

Similar to the previous embodiments the exponentiation is approximated by domain change from fixed to floating point. However in this particular embodiment, normalization is done at the boundaries of node/branch update. This structure resembles LDPC check node approximation described U.S. patent application Ser. No. 10/117,264 entitled "NODE PROCESSORS FOR USE IN PARITY CHECK DECODERS", but instead of shifting a constant factor by an integer input value, a floating point input value is split into exponent and significand, the later augmented with a hidden '1', shifted by the exponent part and then forwarded to a fixed point accumulator (or a fixed point adder tree for parallel implementation). The normalization of the result is postponed until the all edges/branches have been combined to form an intermediate result. The leading '1' position in the result defines an exponent, the result value is normalized and the exponent is concatenated with the normalized result bits excluding leading '1' to form a floating point value. This floating point value is truncated to the desired precision, saved and later interpreted as fixed point fractional value in the log domain exactly as in other two embodiments.

Figure 4:
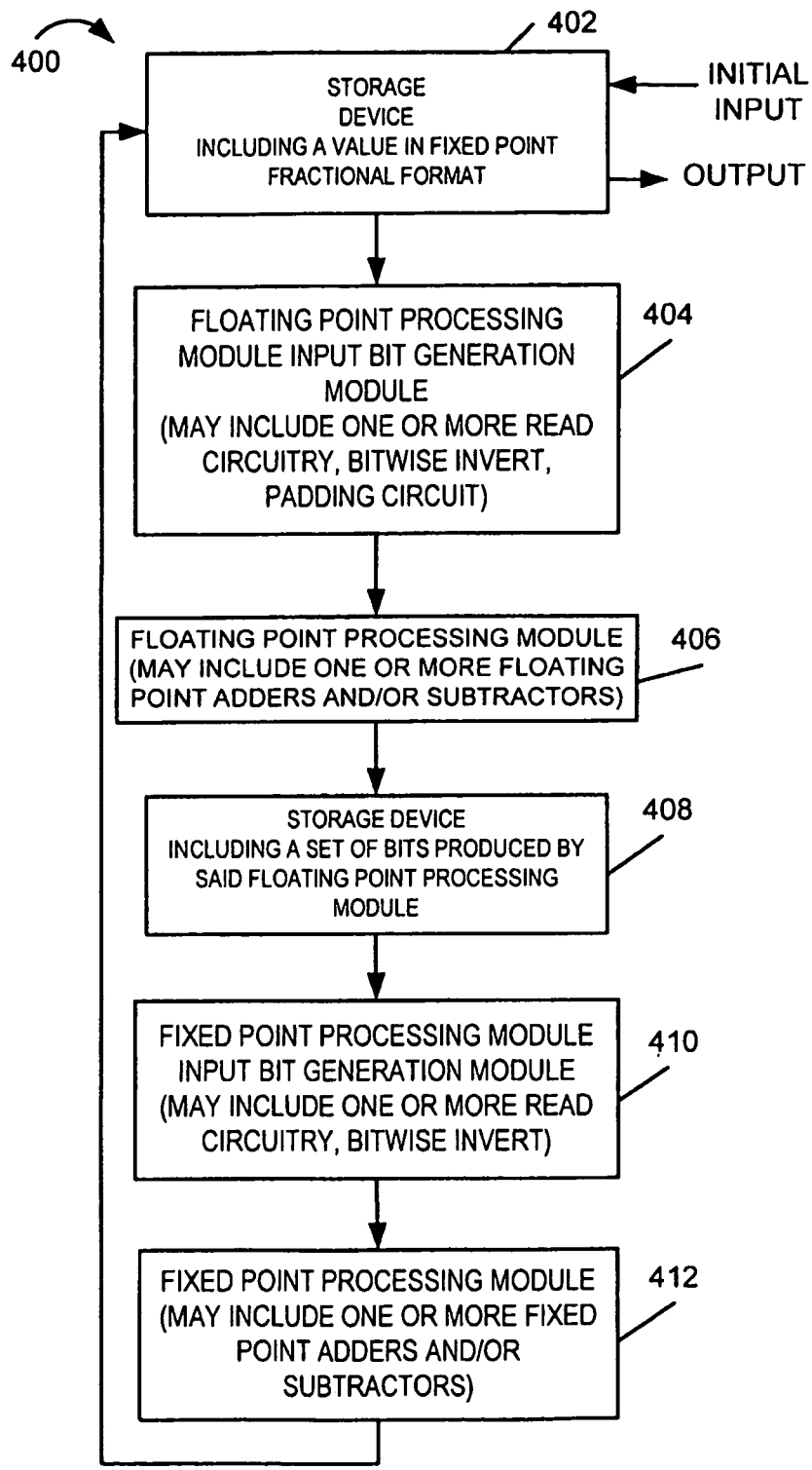
FIG. 4 is a flow chart illustrating how the exp and/or log approximation functions of the present invention may be used in an iterative manner.

FIG. 4 illustrates a set of modules and storage devices which may be used to implemented the methods and apparatus of the present invention. Arrows in FIG. 4 are used to show the direction of the data flow from module to module. The illustrated system 400 includes a first storage device 402 which is used to store a value in a fixed point fractional format. The storage device 402, which may be a memory or register for example, is coupled to a floating point processing module input bit generation module 404 which is responsible for generating a set of bits to be used as the input to a floating point processing module 406. As discussed above, the floating point processing module input bit generation module 404 is implemented, in some embodiments, as a simple read circuit in which a set of bits, e.g., all, 50%, 70% or more of the bits of the value stored in memory 402, are supplied to the floating point processing module 406 without alteration. In other embodiments floating point processing module input bit generation module 404 includes a bitwise inverter, and/or a padding circuit. The bitwise inverter is used, when present, to flip (invert) the value of at least a set of bits obtained from the storage device 402 prior to the bits being supplied to the floating point processor 406 while the padding circuit, when present, can be used to supply padding values, e.g., constant values, which in some embodiments are zeros.

Floating point processing module 406 receives the input bits generated by module 404 and performs one or more floating point commutations using the input bits. Floating point processing module 406 includes one or more floating point processing elements, e.g., one or more floating point adders and/or subtractors. The set of bits produced by one or more floating point computations performed by the floating point processing module 406 which used the input bits from module 404, are stored in a second storage device 408. This second storage device 408, like storage device 402, may be implemented using a register or memory. The set of bits produced by the floating point processing module 406, which are stored in storage device 408, are processed by the fixed point processing module 410 and supplied by the module 410 to the input of the fixed point processing module 412. The module 410 may perform a simple read operation and supply all or a portion of the bits read from storage device 408 to the fixed point processing module 412. However, in some embodiments, the module 410 performs a bitwise inversion operation on the bits which are read from the storage device 408 prior to supplying them to the fixed point processing module 412. The fixed point processing module 412 includes one or more fixed point adders and/or subtractors for performing fixed point computations, e.g., on values assumed to be represented in fixed point fractional format. The resulting value generated by the fixed point computation or computations performed in step 412 are shown as being stored in storage device 402 for continued processing, e.g., in an iterative manner. While shown as an iterative process, it should be appreciated that multiple sequential transitions between the use of floating point and fixed point operations may occur in a linear, non-iterative implementation while still taking advantage of the novel computation estimations achieved as a result of the non-conventional mapping of values used in the fixed and floating point operations.

The initial input to the iterative process shown in FIG. 4 is shown being located into storage device 402 with the result, e.g., after some number of iterative operations, being read out of the same storage device. It should be appreciated that the input/out could also be supplied to storage device 408 with the input bits being in a floating point format. The output could also be read out from storage device 408 in such an embodiment.

Figure 5:
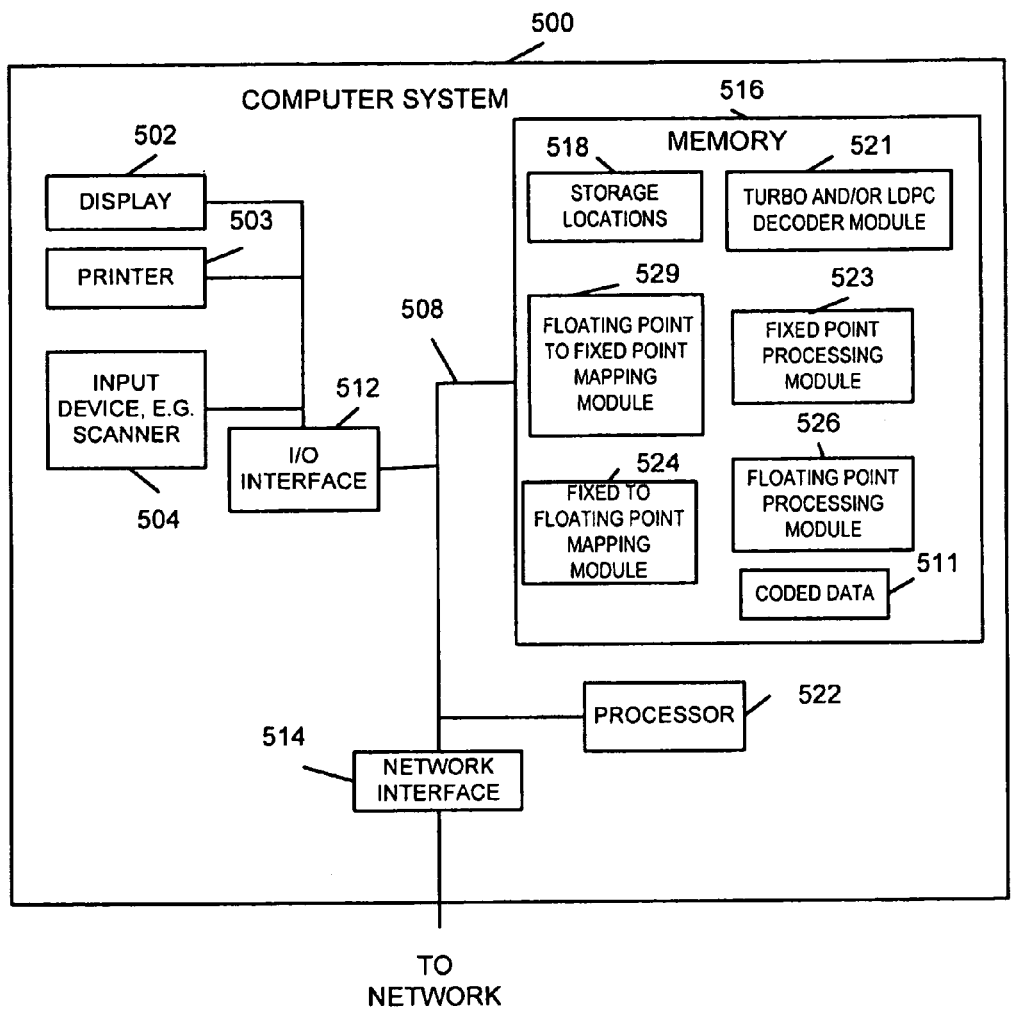
FIG. 5 illustrates a computer system which includes various software modules which use the exp and/or log approximation functions of the present invention to perform, e.g., LDPC decoding operations, turbo decoding operations another operation involving the use of an approximation of a log and/or exp computation operation.

FIG. 5 illustrates a computer system implemented in accordance with one embodiment of the present invention which supports a software based LDPC decoder and/or Turbo decoder. The system 500 includes a processor, 522, network interface 514, I/O interface 512, and memory 516 which are coupled together by a bus 508 over which the various elements may interchange data and other information. The system 500 includes a display 502, printer 503 and input device 504, e.g., keyboard or scanner, which are coupled to the I/O interface 512. Via network interface 514, the system 500 may receive information, e.g., LDPC coded data, to be decoded. The coded information 511 may be stored in memory 516 for processing by the decoder module 521.

Memory 516 includes a plurality of storage locations 518, a floating point to fixed point mapping module 529, a fixed to floating point mapping module 524, a fixed point processing module 523, a floating point processing module 526 and a turbo and/or LDPC decoder module 521. The storage locations 518 are used to store sets of bits, e.g., sets of bits produced by fixed point or floating point computations. Turbo and/or LDPC decoder module 521, when executed by processor 522, causes the processor 522 to perform a Turbo and/or LDPC decoding operation. The module 521 may call modules 529, 524, 523 and 526 one or more times during a decoding operation. Fixed point processing module 523 causes one or more fixed point computations to be performed on the input to the module 523. Floating point processing module 526 performs one or more floating point computations on a set of bits which are input to the module 526. Fixed point to floating point mapping module 524 is responsible for generating the input set of bits to be supplied to the floating point module 526 from a value represented in a fixed point fractional format. The mapping module 524 may simply supply the value to floating point processing module 526, it may pad the value and/or it may perform a bitwise inversion operation on at least some bits. Mapping module 524 determines the value of a plurality of individual bits in a generated floating point processing module input bit set on a per bit basis from a corresponding number of bits in a value represented in a fixed point fractional format. Fixed to floating point mapping module 524 is used to map a set of bits generated by a floating point operation to produce a set of input bits to the fixed point processing module 523. The mapping operation may involve a simple read operation but in some cases involves a bitwise inversion operation. A plurality of individual bits in the input set of bits to the fixed point processing module 523 that is produced by the floating point to fixed point mapping module 529 are generated from corresponding individual bits in a set of bits generated by a floating point computation performed by the floating point processing module 526.

By switching between fixed and floating point operations, the decoder module 521 can take advantage of the exp and log computation approximation techniques of the present invention, e.g., at different stages of in iterative LDPC decoding process.

Figure 6:
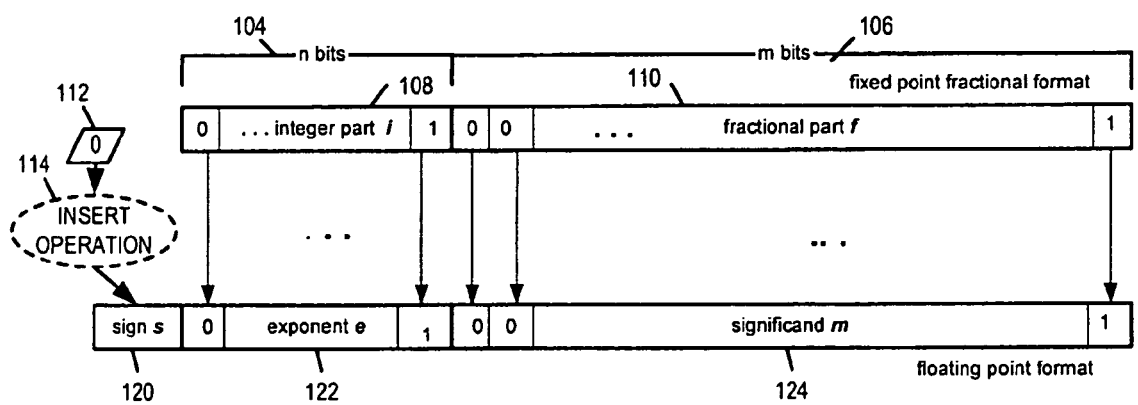
FIG. 6 illustrates an exemplary step of generating a set of floating point processing module input bits from a stored value represented in a fixed point fractional format.

FIG. 6 illustrates an exemplary step of generating a set of floating point processing module input bits from a stored value represented in a fixed point fractional format. The value represented in fixed point fractional format may include a large number of bits, e.g., at least 32 bits. In the FIG. 6 example, the floating point input bit values are directly mapped from the values found in the corresponding bit locations of the value represented in fixed point fraction format as can be done by a simple read operation and an additional padding bit, e.g., a zero is inserted to occupy the sign position of the floating point input set of bits. Note that this bit level mapping used to generate a floating point input set of bits is significantly different from a conventional conversion between fixed point and floating point representations.

A few examples of processing using the approximation methods of the invention will now be discussed to facilitate an understanding of the invention and its advantages.

Consider the following numerical example of an approximation operation for unsigned positive numbers (the algorithm can be also applied to signed values with minor modifications). Let the fixed fractional format be comprised of 8-bit field designating the integer part i and 23-bit field designating the fractional part f. Any positive real number x between 0 and 256 can be represented in this format with a roundoff error of less than $2^{-23}$ in the form $x=i+0.f$ Let the corresponding floating point format be comprised of 8-bit field designating the binary exponent and 23-bit field designating normalized significand (excluding leading '1'). The exponent value is biased by +127 i.e. actual binary exponent value 0 corresponds to exponent filed value 127. The field width of 8 and 23 bits and the exponent bias are chosen to resemble IEEE-754 single precision floating point format strictly for illustration purposes (omitting the sign bit and exception cases for simplicity). Moreover the exponent bias is irrelevant for the suggested approximation method. Any positive real number x between 0 and $2^{128}$ can be represented in this format in the form $x=2^{e+127} \times 1.m$ Let U,V be positive numbers U=7.375 and V=11.750. U and V may be vided as inputs 102 to the processing shown in FIG. 1.

Their fixed fractional point representation i.f is:

(1)

U=00000111.01100000000000000000000b i=7=00000111b f=0.375=01100000000000000000000b

V=00001011.11000000000000000000000b i=11=00001011b f=0.750=11000000000000000000000b

The same values can be represented in the described above floating point format e.m as:

(2)
U=10000010.11011000000000000000000b
e=3 (the leftmost '1' position in 7)+127 (exponent bias)=130=10000010b
m=11101100 . . . b (excluding leftmost '1')
V=10000011.01111000000000000000000b
e=4 (the leftmost '1' position in 11)+127 (exponent bias)=131=10000011b
m=11101100 . . . b (excluding leftmost '1')

Note that this representation will not be used in any examples shown below. The representation (2) is a conventional type conversion of representation (1).

Example 1

Let the values U,V be represented in the fixed fractional point format i.f and the goal being to find an approximation of W=$\log_2(2^u + 2^v)$ using the approximation method of the invention.

Step 1, create two synthetic floating point values X and Y by mapping bits directly from i fields of U,V (1) to e fields of X,Y and from f fields of U,V to m fields of X,Y.
X=00000111.01100000000000000000000b
e=00000111b
m=01100000000000000000000b
Y=00001011.11000000000000000000000b
e=00001011b
m=11000000000000000000000b Note that X and Y are not the floating point representation of U and V shown in (2) For example in C programming language this operation is not a type cast from integer type to float type but rather an interpretation change which can be accomplished by using a union of a floating point variable and an integer variable written as an integer and read as a floating point value.

Step 2, add two floating point values Z=X+Y using a floating point adder. This corresponds to a floating point addition computation in step 126. (IEEE-754 standard explains how to perform a floating point addition as done in this example).
Z=00001011.11010110000000000000000b
e=00001011b
m=11010110000000000000000b Step 3, create a fixed fractional point value W, which correspond to output value 142 in FIG. 1, by mapping bits directly from e field of Z to i field of W and from m field of Z to f field of W.
W=00001011.11010110000000000000000b
i=00001011b
f=11010110000000000000000b As in step 1, in C programming language this operation is not a type cast from float type to integer type but rather an interpretation change which can be accomplished by using a union of a floating point variable and an integer variable written as a floating point value and read as an integer value.

The resulting value W in fixed point fractional binary format represents 11.8359375 in decimal format and is a good approximation of an exact answer $\log_2(2^{7.375} + 2^{11.750}) = 11.8179\ldots$. The computation sequence required no calls to $\log_2(x)$ or $2^x$ functions and no true type conversion operations.

Step 4 (optional), perform additional fixed point computations with value W using fixed point arithmetic unit.

Example 2

P Let the values U,V be represented in the fixed fractional point format i.f and the goal is to find an approximation of W=$-\log_2(2^{-u} + 2^{-v})$ using the proposed method. This operation illustrates LDPC decoder check node magnitude processing. As described before this can be re-written as W=$k-\log_2(2^{k-u} + 2^{k-v})$ and the choice of constant k is arbitrary. Selecting k in the form k=$2^n-1$ and such that k>U,V allows replacing subtraction operation with a simple bit inversion. For the following example k=255 ($2^8-1$) and U,V values are the same as in the previous example.

Step 1, create two synthetic floating point values X and Y by mapping and inverting bits from i fields of U,V (1) to e fields of X,Y and from f fields of U,V to m fields of X,Y.
X=11111000.10011111111111111111111b
e=11111000b
m=10011111111111111111111b
Y=11110100.00111111111111111111111b
e=11110100b
m=00111111111111111111111b Note that X and Y are not the floating point representation of U and V shown in (2) For example in C programming language this operation is not a type cast from integer type to float type but rather an interpretation change which can be accomplished by using a union of a floating point variable and an integer variable written as an integer with a bit-wise inversion and read as a floating point value.

Step 2, add two floating point values Z=X+Y using a floating point adder. (IEEE-754 standard explains how to perform floating point addition as done in this example).
Z=11111000.10110011111111111111110b
e=11111000b
m=10110011111111111111110b Step 3, create a fixed fractional point value W by mapping and inverting bits from e field of Z to i field of W and from m field of Z to f field of W.
W=00000111.01001100000000000000001b
i=00000111b
f=01001100000000000000001b As in step 1, in C programming language this operation is not a type cast from float type to integer type but rather an interpretation change which can be accomplished by using a union of a floating point variable and an integer variable written as a floating point value and read as an integer value followed by a bit-wise inversion.

The resulting value W in fixed point fractional binary format represents 7.296875 in decimal format and is a good approximation of an exact answer $-\log_2(2^{-7.375} + 2^{-11.750}) = 7.307094\ldots$. The computation sequence required no calls to $\log_2(x)$ or $2^x$ functions and no true type conversion operations.

Step 4 (optional), perform one or more fixed point computations with value W using a fixed point arithmetic unit.

While in many embodiments, the fixed point fraction value and the input/output bits corresponding to various floating point processing operations are stored in a memory device such as a register, the operations may be performed sequential without the need to store the values.

One embodiment of the invention is directed to a method of processing a set of binary values using at least one floating point processing module, where the method includes the steps of generating a set of floating point processing module input bits from a value represented in a fixed point fractional format, each individual bit of at least a portion of said value determining a bit value of a corresponding individual bit in said set of floating point processing module input bits; operating the floating point processing module to perform at least one floating point processing computation using said generated set of floating point processing module input bits as an input to the at least one floating point computation, said floating point computation module producing from the processing of said set of floating point processing module input bits a second set of bits arranged in a floating point format; and generating a set of fixed point processing module input bits from the second set of bits arranged in a floating point format; and operating the fixed point processing module to perform at least one fixed point processing computation using said generated set of fixed point processing module input bits. In some implementations of the exemplary method the portion of said value includes multiple bits, said multiple bits including at least 50% of the bits in said value. In some implementation of the exemplary method the portion of said value includes at least 70% of the bits in said value, wherein said value includes at least 32 bits, and wherein said portion of said value includes at least 31 bits. 4. In some embodiments of the exemplary method the portion of said value includes at least two bits corresponding to an integer portion of said value and at least three bits corresponding to a fraction portion of said value, said portion including at least said two and three bits. The step of generating a set of floating point processing module input bits in many implementations of the exemplary method includes reading the stored value from a storage device such as a register or memory location.

The methods of the present invention may be implemented using software, hardware and/or a combination of software and hardware. Decoder implemented using the present invention can be used in a wide range of devices and applications including wireless terminals, e.g., mobile nodes, which perform LDPC decoding and/or turbo decoding operations.

In various embodiments described herein are implemented using one or more modules to perform the steps corresponding to one or more methods of the present invention, e.g., steps involving the sets of bits to be subjected to subsequent processing. Such modules may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, the present invention is directed to a machine-readable medium including machine executable instructions for causing a machine, e.g., processor and associated hardware, to perform one or more of the steps of the above-described method(s).

Numerous additional variations on the methods and apparatus of the present invention described above will be apparent to those skilled in the art in view of the above description of the invention. Such variations are to be considered within the scope of the invention. The methods and apparatus of the present invention may be, and in various embodiments are, used with CDMA, orthogonal frequency division multiplexing (OFDM), and/or various other types of communications techniques which may be used to provide wireless communications links between access nodes and mobile nodes which may communicate data or other information requiring decoding.

What is claimed is:

1. A decoder comprising:
a memory configured to store an input value having an integer part and a fractional part; and
mapping circuitry coupled to the memory and configured to calculate a floating point number having an exponent value mapped from the integer part by inserting the inter part into an exponent field of the floating point number to generate the exponent value and further having a significand value mapped from the fractional part by inserting the fractional part into a significand field of the floating point number to generate the significand value.

2. The decoder of claim 1 wherein the decoder is one of a low density parity check decoder, and a turbo-convolutional decoder.

3. The decoder of claim 1 wherein the mapping circuitry is further configured to approximate an exponentiation operation that corresponds to calculating $2^{k-x}$, wherein x corresponds to the input value and k corresponds to a scaling value.

4. The decoder of claim 3 wherein the exponentiation operation is a base ten exponentiation operation.

5. The decoder of claim 3 wherein the exponentiation operation is a base two exponentiation operation.

6. The decoder of claim 1 further comprising:
floating point processing circuitry configured to generate a floating point output value based at least in part on the floating point number; and
second mapping circuitry configured to calculate a fixed point fractional output value by inserting an exponent part of the floating point output value into an integer field of the fixed point fractional output value and by inserting a significand part of the floating point output value into a fractional field of the fixed point fractional output value.

7. A decoder comprising:
means for storing an input value having an integer part and a fractional part; and
means for mapping the integer part to an exponent value by inserting the integer part into an exponent field of a floating point number to generate the exponent value and for mapping the fractional part to a significand value by inserting the fractional part into a significand field of the floating point number to generate the significand value.

8. The decoder of claim 7 wherein the decoder is a low density parity check decoder and the mapping means is configured to perform a bit-wise inversion operation.

9. The decoder of claim 7 wherein the decoder is a turbo-convolutional decoder.

10. The decoder of claim 7 further comprising:
means for generating a floating point output value based at least in part on the floating point number; and
means for calculating a fixed point fractional output value by inserting an exponent part of the floating point output value into an integer field of the fixed point fractional output value and by inserting a significand part of the floating point output value into a fractional field of the fixed point fractional output value.

11. A computer-readable tangible medium storing instructions executable by a computer, the instructions comprising:
instructions that are executable by the computer to store an input value in memory, the input value having an integer part and a fractional part; and
instructions that are executable by the computer to map the integer part to an exponent value by inserting the integer part into an exponent field of a floating point number to generate the exponent value and that are further executable by the computer to map the fractional part to a significand value by inserting the fractional part into a significand field of the floating point number to generate the significand value.

12. The computer-readable tangible medium of claim 11 wherein mapping the integer part and the fractional part is performed in a low density parity check decoder.

13. The computer-readable tangible medium of claim 11 wherein mapping the integer part and the fractional part is performed in a turbo-convolutional decoder.

14. A method comprising:
- generating, by first mapping circuitry, a first floating point value having a floating point format at least in part by performing a first interpretation change operation with respect to a first fixed fractional point value having a fixed fractional point format;
- performing, by floating point processing circuitry, at least one operation based on the first floating point value to generate a second floating point value; and
- generating, by second mapping circuitry, a second fixed fractional point value having the fixed fractional point format at least in part by performing a second interpretation change operation with respect to the second floating point value.

15. The method of claim 14, wherein performing the first interpretation change operation includes directly mapping an integer portion of the first fixed fractional point value to an exponent portion of the first floating point value and further includes directly mapping a fractional portion of the first fixed fractional point value to a significand portion of the first floating point value.

16. The method of claim 14, wherein generating the first floating point value approximates negating, scaling, and exponentiating the first fixed fractional point value.

17. The method of claim 16, wherein generating the first floating point value approximates $2^{k-x}$, wherein x corresponds to the first fixed fractional point value and k corresponds to a scaling value.

18. The method of claim 14, wherein performing the second interpretation change operation directly converts the second floating point value from the floating point format to the fixed fractional point format, and wherein performing the first interpretation change operation does not include calling a logarithm function and further does not include performing a type conversion operation.

* * * * *